United States Patent
Kim et al.

(10) Patent No.: US 8,110,981 B2
(45) Date of Patent: Feb. 7, 2012

(54) ORGANIC LIGHT-EMITTING DISPLAY APPARATUS

(75) Inventors: Won-Jong Kim, Suwon-si (KR);
Yoon-Hyeung Cho, Suwon-si (KR);
Min-Ho Oh, Suwon-si (KR);
Jong-Hyuk Lee, Suwon-si (KR);
Yong-Tak Kim, Suwon-si (KR);
So-Young Lee, Suwon-si (KR);
Jin-Baek Choi, Suwon-si (KR);
Sun-Young Lee, Suwon-si (KR);
Byoung-Duk Lee, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 296 days.

(21) Appl. No.: 12/038,725

(22) Filed: Feb. 27, 2008

(65) Prior Publication Data

US 2008/0297032 A1      Dec. 4, 2008

(30) Foreign Application Priority Data

May 30, 2007 (KR) .................. 10-2007-0052925

(51) Int. Cl.
*H01L 51/00* (2006.01)
(52) U.S. Cl. ..................... 313/504; 313/506
(58) Field of Classification Search ........... 313/498–512
See application file for complete search history.

(56) References Cited

U.S. PATENT DOCUMENTS

| | | | |
|---|---|---|---|
| 6,246,179 B1* | 6/2001 | Yamada .................... | 315/169.3 |
| 2003/0107314 A1* | 6/2003 | Urabe et al. .................. | 313/506 |
| 2004/0080476 A1* | 4/2004 | Tsai et al. ...................... | 345/82 |
| 2004/0096771 A1* | 5/2004 | Kashiwagi et al. .......... | 430/192 |
| 2006/0284169 A1* | 12/2006 | Park et al. ..................... | 257/40 |
| 2007/0029548 A1* | 2/2007 | Yamazaki et al. ............. | 257/40 |

FOREIGN PATENT DOCUMENTS

| | | |
|---|---|---|
| JP | 2003-249370 A | 9/2003 |
| KR | 10-2004-0066624 A | 7/2004 |
| KR | 10-2005-0087284 A | 8/2005 |

* cited by examiner

*Primary Examiner* — Anne Hines
(74) *Attorney, Agent, or Firm* — Christie, Parker & Hale, LLP

(57) ABSTRACT

Provided is an organic light-emitting display apparatus with improved contrast. The organic light-emitting display apparatus includes: a substrate; an organic light-emitting device on the substrate, the organic light-emitting device including a first electrode, a second electrode, and an organic light-emitting layer between the first electrode and the second electrode; and a pixel define layer on the first electrode, the pixel define layer including an opening through which the first electrode is exposed and having a black color, wherein the organic light-emitting layer and the second electrode are sequentially disposed on a portion of the first electrode exposed through the opening, and the second electrode includes indium oxide doped with a metal or metal oxide.

21 Claims, 2 Drawing Sheets

ORGANIC LIGHT-EMITTING DISPLAY APPARATUS

CROSS-REFERENCE TO RELATED PATENT APPLICATION

This application claims priority to and the benefit of Korean Patent Application No. 10-2007-0052925, filed on May 30, 2007, in the Korean Intellectual Property Office, the entire content of which is incorporated herein by reference.

BACKGROUND OF THE INVENTION

1. Field of the Invention

The present invention relates to an organic light-emitting display apparatus, and more particularly, to an organic light-emitting display apparatus for improving contrast.

2. Description of the Related Art

Organic or inorganic light-emitting display apparatuses are flat panel display apparatuses that can be made to be relatively thin and portable. In addition, organic or inorganic light-emitting display apparatuses are self-emitting display apparatuses that have relatively wide viewing angle, good contrast, and rapid response speed, and thus, have been spotlighted as next generation display apparatuses. In particular, organic light-emitting display apparatuses including a light-emitting layer formed of an organic material exhibit better brightness, driving voltage, and response speed characteristics than inorganic light-emitting display apparatuses, and can provide multicolored images.

Flat panel display apparatuses are manufactured to be relatively lightweight and thin in order to be portable and to be used outdoors. However, flat panel display apparatuses have problems in that contrast and visibility are lowered due to sunlight reflection when images are viewed outdoors. In particular, this problem is more serious in organic light-emitting display apparatuses because such reflection strongly occurs on a metal reflective layer.

SUMMARY OF THE INVENTION

An aspect of an embodiment of the present invention is directed toward an organic light-emitting display apparatus having an improved contrast by preventing the reflection of external light.

An embodiment of the present invention provides an organic light-emitting display apparatus including: a substrate; an organic light-emitting device on the substrate, the organic light-emitting device comprising a first electrode, a second electrode, and an organic light-emitting layer between the first electrode and the second electrode; and a pixel define layer on the first electrode, the pixel define layer including an opening through which the first electrode is exposed and having a black color, wherein the organic light-emitting layer and the second electrode are sequentially disposed on a portion of the first electrode exposed through the opening, and wherein the second electrode comprises indium oxide doped with a metal and/or metal oxide.

The pixel define layer may include a mixture of an insulating material and a black pigment.

The insulating material may include a material selected from the group consisting of polyimide, acryl, acrylate, silica, and combinations thereof.

The black pigment may be carbon black or titanium black.

An absolute work function value of the metal or the metal oxide may be smaller than that of the indium oxide.

The metal may include a material selected from the group consisting of ytterbium (Yb), calcium (Ca), magnesium (Mg), samarium (Sm), cesium (Cs), barium (Ba), strontium (Sr), yttrium (Y), lanthanum (La), and combinations thereof.

The metal oxide may include a material selected from the group consisting of strontium oxide, calcium oxide, cesium oxide, barium oxide, yttrium oxide, lanthanum oxide, and combinations thereof.

The organic light-emitting display may further include a sealing member and an antireflective layer on a surface of the sealing member facing away from the organic light-emitting device.

The antireflective layer may include a material selected from the group consisting of $SiO_2$, $MgF$, $Al_2O_3$ $TiO_2$, $ZrO_2$, $ZnS$, $ITO$, $CeF_3$, $Ta_2O_5$, $Nb_2O_5$, and combinations thereof.

The first electrode may be an anode and the second electrode may be a cathode.

The second electrode may be a transmissive electrode to allow external light to reach the pixel define layer.

Another embodiment of the present invention provides an organic light-emitting display apparatus including: a substrate; an organic light-emitting device on the substrate, the organic light-emitting device comprising a first electrode, a second electrode, and an organic light-emitting layer between the first electrode and the second electrode; and a pixel define layer on the first electrode, the pixel define layer comprising an opening through which the first electrode is exposed and including a mixture of an insulating material and a pigment for reducing reflection of external light, wherein the organic light-emitting layer is on a portion of the first electrode exposed through the opening and between the second electrode and the first electrode, and wherein the second electrode comprises indium oxide doped with a metal.

The pigment may be carbon black.

The pigment may be titanium black.

The insulating material may include a material selected from the group consisting of polyimide, acryl, acrylate, silica, and combinations thereof.

The organic light-emitting display may further include a sealing member and an antireflective layer on a surface of the sealing member facing away from the organic light-emitting device.

An absolute work function value of the metal may be smaller than that of the indium oxide.

Another embodiment of the present invention provides an organic light-emitting display apparatus including: a substrate; an organic light-emitting device on the substrate, the organic light-emitting device comprising a first electrode, a second electrode, and an organic light-emitting layer between the first electrode and the second electrode; and a pixel define layer on the first electrode, the pixel define layer including an opening through which the first electrode is exposed and including a mixture of an insulating material and a pigment for reducing reflection of external light, wherein the organic light-emitting layer is on a portion of the first electrode exposed through the opening and between the second electrode and the first electrode, and wherein the second electrode includes indium oxide doped with a metal oxide.

The metal oxide may include material selected from the group consisting of strontium oxide, calcium oxide, cesium oxide, barium oxide, yttrium oxide, lanthanum oxide, and combinations thereof.

The absolute work function value of the metal oxide may be smaller than that of the indium oxide.

BRIEF DESCRIPTION OF THE DRAWINGS

The accompanying drawings, together with the specification, illustrate exemplary embodiments of the present inven

DETAILED DESCRIPTION

Figure 1:
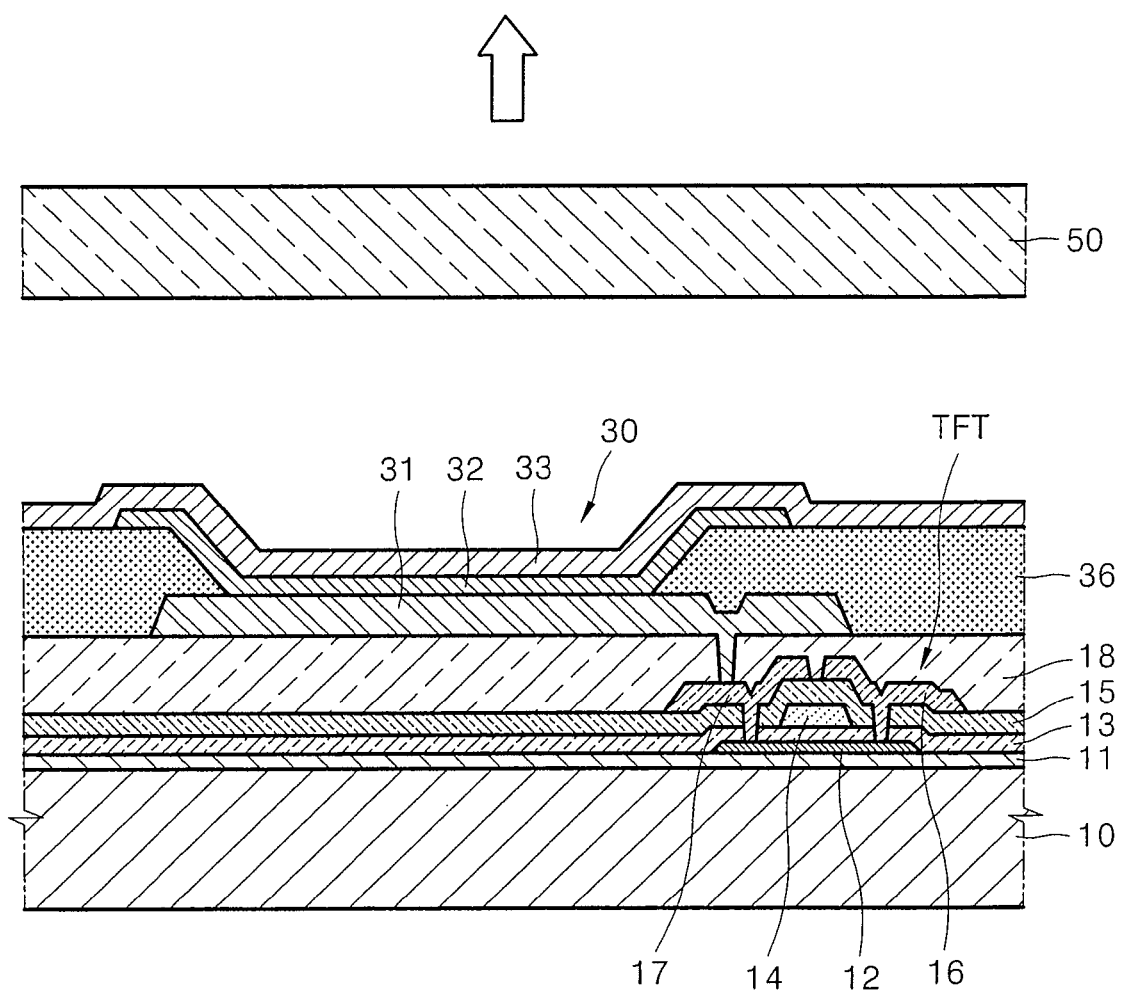
- FIG. 1 is a schematic sectional view illustrating an organic light-emitting display apparatus according to an embodiment of the present invention.

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. Like reference numerals designate like elements throughout the specification.

FIG. 1 is a schematic sectional view illustrating an organic light-emitting display apparatus according to an embodiment of the present invention. Organic light-emitting display apparatuses are generally classified into active matrix type (AM) and passive matrix type (PM). FIG. 1 illustrates an AM organic light-emitting display apparatus, but the present invention is not limited thereto. The present invention can also be applied to a PM organic light-emitting display apparatus.

In the PM organic light-emitting display apparatuses, anodes (or data electrodes) and cathodes (or scan electrodes) are respectively arranged in a column-wise manner (or direction) and a row-wise manner (or direction). Scanning signals are supplied to the cathodes from a row driving circuit. Here, one row is selected from a plurality of rows. A column driving circuit supplies data signals to pixels through the anodes (or the data electrodes). By contrast, in the AM organic light-emitting display apparatuses, a signal to be input into each pixel is controlled by a thin film transistor (TFT). The AM organic light-emitting display apparatuses are suitable to process a relatively large amount of signals, and thus, can be use as display apparatuses for creating dynamic images.

Referring to FIG. 1, the organic light-emitting display apparatus includes a substrate 10, an organic light-emitting device 30, and a pixel define layer 36.

The substrate 10 may be formed of a transparent glass material having $SiO_2$ as a main component. A material for the substrate 10 is not limited thereto and may also be a transparent plastic material. The plastic substrate may be formed of an insulating organic material. The insulating organic material may be selected from polyethersulphone (PES), polyacrylate (PAR), polyetherimide (PEI), polyethylene naphthalate (PEN), polyethyeleneterephthalate (PET), polyphenylene sulfide (PPS), polyallylate, polyimide, polycarbonate (PC), cellulose triacetate (TAC), and/or cellulose acetate propinonate (CAP).

In a bottom-emission type organic light-emitting display apparatus in which light images are directed toward the substrate 10, the substrate 10 is formed of a transparent material. However, in a top-emission type organic light-emitting display apparatus in which light images are directed toward an opposite direction to the substrate 10, as illustrated in FIG. 1, it is not necessarily required that the substrate 10 be formed of a transparent material. That is, the substrate 10 may be formed of a metal that is non-transparent to light. In this case, the substrate 10 may include iron, chromium, manganese, nickel, titanium, molybdenum, stainless steel (SUS), Invar alloy, ZInconel alloy, and/or Kovar alloy, but the present invention is not limited thereto. The substrate 10 may also be formed of a metal foil.

When the substrate 10 is formed of a flexible material, such as a metal foil or a plastic, an organic light-emitting display apparatus is relatively easy to carry and can be easily installed on a curved wall.

A buffer layer 11 may be disposed on the substrate 10 in order to make the substrate 10 smooth and to prevent (or reduce) the penetration of impurity elements. The buffer layer 11 may be formed of $SiO_2$ and/or SiNx, or the like.

A thin film transistor TFT is disposed on the substrate 10. At least one thin film transistor TFT is formed in each pixel and is electrically connected to the organic light-emitting device 30. The components of the TFT are described below.

In detail, an active layer 12 in a pattern (that may be predetermined) is disposed on the buffer layer 11. The active layer 12 may be formed of an inorganic semiconductor, such as amorphous silicone or polysilicone, or an organic semiconductor, and includes a source region, a drain region, and a channel region.

A gate insulating layer 13 is disposed on the active layer 12. The gate insulating layer 13 may be formed of an inorganic material, such as metal oxide or metal nitride, or an organic material, such as an insulating polymer.

A gate electrode 14 is disposed on a portion (or a predetermined portion) of the gate insulating layer 13. The gate electrode 14 is connected to a gate line for supplying a TFT on/off signal. The gate electrode 14 may be formed of a metal or a metal alloy, e.g., Au, Ag, Cu, Ni, Pt, Pd, Al, Mo, Al:Nd alloy, or Mo:W alloy, but is not limited thereto.

An inter-insulating layer 15 is disposed on the gate electrode 14, and a source electrode 16 and a drain electrode 17 are respectively disposed to contact the source and drain regions of the active layer 12 via contact holes. The source electrode 16 and the drain electrode 17 may be formed of Al, Mo, or a metal alloy composed of two or more metals, e.g., Al:Nd alloy or MoW alloy, in addition to Au, Pd, Pt, Ni, Rh, Ru, Ir, or Os, but is not limited thereto.

The thin film transistor TFT is covered and protected with a passivation layer 18. The passivation layer 18 may be formed as an inorganic insulating layer and/or an organic insulating layer. The inorganic insulating layer may include $SiO_2$, SiNx, SiON, $Al_2O_3$, $TiO_2$, $Ta_2O_5$, $HfO_2$, $ZrO_2$, BST, PZT, or the like. The organic insulating layer may include a general polymer (e.g. PMMA, PS), a phenol group-containing polymer derivative, an acrylic polymer, an imide-based polymer, an arylether-based polymer, an amide-based polymer, a fluorinated polymer, a p-xylene-based polymer, a vinylalcohol-based polymer, or a blend thereof. The passivation layer 18 may be formed as a composite stack structure of an inorganic insulating layer and an organic insulating layer.

A first electrode 31 for serving as an anode of the organic light-emitting device 30 is disposed on the passivation layer 18, and is partially covered with the pixel define layer 36 formed of an insulating material. The first electrode 31 may be a reflective electrode or a transmissive electrode. When the first electrode 31 is a reflective electrode, it may be structured such that a layer formed of a material with a high work function, e.g., ITO, IZO, ZnO, and/or In2O3, is disposed on a layer formed of Ag, Mg, Al, Pt, Pd, Au, Ni, Nd, Ir, Cr, Li, Ca, or combinations thereof.

The pixel define layer 36 is an insulating layer and may be formed to have a color with a high degree of light-absorption (or blackness). If the pixel define layer 36 has a white color, a top-emission type organic light-emitting display apparatus may strongly reflect external light, thereby reducing contrast. The same also happens in a reflective pixel define layer.

According to the current embodiment of the present invention, the pixel define layer 36 is formed to have a color with a high degree of light-absorption (or blackness), and thus, reflection of external light incident on a front surface of an organic light-emitting display apparatus can be minimized. The reduction in external light reflection results in improvement in contrast. The pixel define layer 36 is formed of a mixture of an insulating material and a black pigment. The insulating material used for the pixel define layer 36 may be polyimide, acryl, acrylate, and/or silica. The black pigment to be mixed with the insulating material may be carbon black or titanium black. The degree of blackness of the pixel define layer 36 can be adjusted by adjusting the ratio of the black pigment to the insulating material.

An opening is formed in the pixel define layer 36, and an organic light-emitting layer 32 of the organic light-emitting device 30 is disposed in (or near) a region defined by the opening. A transmissive second electrode 33 for serving as a cathode of the organic light-emitting device 30 is disposed to cover all the pixels.

The organic light-emitting device 30 emits light according to a current flow to display images, and includes the first electrode 31 electrically coupled to the drain electrode 17 of the thin film transistor TFT via a contact hole, the organic light-emitting layer 32, and the second electrode 33.

The first electrode 31 may be formed in a pattern (that may be predetermined) by photolithography. In a PM organic light-emitting display apparatus, the first electrode 31 may be patterned in linear stripes which are separated from each other by a distance (that may be predetermined). In an AM organic light-emitting display apparatus, the first electrode 31 may be formed to correspond to the pixels. The second electrode 33 is disposed on the first electrode 31 and is connected to an external terminal so as to be used as a cathode. In a PM organic light-emitting display apparatus, the second electrode 33 may be formed in stripes which are perpendicular to the patterns of the first electrode 31. In an AM organic light-emitting display apparatus, the second electrode 33 may be formed over the entire active region to display images.

In a top-emission type organic light emitting display apparatus in which light images are directed toward the second electrode 33, as illustrated in FIG. 1, the second electrode 33 may be formed as a transmissive electrode. Since the second electrode 33 is disposed on the pixel define layer 36, incident external light passes through the second electrode 33 before reaching the pixel define layer 36. If the second electrode 33 is formed of a metal, external light may reflect from the second electrode 33 before reaching the pixel define layer 36, thus increasing the amount of reflected light. As a result, the anti-reflection effect of the pixel define layer 36 having a light-absorbing (or black) color can be insignificant. Thus, the second electrode 33 is formed as a transmissive electrode. When external light passes through the transmissive second electrode 33 and then reaches the pixel define layer 36, reflection of external light is reduced due to the pixel define layer 36 having a light-absorbing (or black) color.

In order for the second electrode 33 to be formed as a transmissive electrode, the second electrode 33 may be formed of indium oxide. However, if the second electrode 33 is formed of only indium oxide, emission efficiency may be reduced due to a high work function. In order to reduce the work function, the second electrode 33 may be formed of indium oxide doped with a metal or metal oxide. In this case, an absolute work function value of the metal or the metal oxide is smaller than that of the indium oxide.

The metal that can be used herein may be ytterbium (Yb), calcium (Ca), magnesium (Mg), samarium (Sm), cesium (Cs), barium (Ba), strontium (Sr), yttrium (Y), and/or lanthanum (La).

The metal oxide that can be used herein may be strontium oxide, calcium oxide, cesium oxide, barium oxide, yttrium oxide, and/or lanthanum oxide.

The second electrode 33 may be formed by thermal deposition. If the deposition temperature of the thermal deposition is too high, the organic light-emitting device 30 may be damaged. Thus, the second electrode 33 may be formed by thermally depositing indium oxide and a metal or metal oxide in the presence of plasma generated in a deposition chamber. When the second electrode 33 is formed in the presence of the plasma generated in the chamber, the deposition temperature can be lowered.

The method of forming the second electrode 33 can be suitably modified. For example, a metal source and an indium source may be thermally deposited under an oxygen atmosphere. In this case, the metal and indium are respectively converted to metal oxide and indium oxide due to the oxygen atmosphere during the thermal deposition, thereby forming a transmissive second electrode in which the indium oxide is doped with the metal oxide. Alternatively, a metal source and an indium oxide source may be thermally deposited under an argon atmosphere. Since argon is an inert gas that does not affect the composition of deposition materials, it is possible to form a transmissive second electrode in which indium oxide is doped with a metal. Further, a transmissive second electrode in which indium oxide is doped with metal oxide may also be formed by thermally depositing a metal oxide source and an indium oxide source under an argon atmosphere. Furthermore, a transmissive second electrode in which indium oxide is doped with metal oxide may be formed by thermally depositing a metal oxide source and an indium source under an oxygen atmosphere. In this case, during the deposition, indium is oxidized to indium oxide. Still furthermore, a transmissive second electrode in which indium oxide is doped with metal oxide may also be formed by thermally depositing a metal oxide source and an indium oxide source under an oxygen atmosphere. Also, a transmissive second electrode may be formed by thermally depositing a metal source and an indium source under a mixed atmosphere of oxygen and argon or thermally depositing a metal source and an indium oxide source under a mixed atmosphere of oxygen and argon.

The second electrode 33 may also be formed such that indium oxide is doped with both a metal and metal oxide. For example, a transmissive second electrode in which indium oxide is doped with a metal and a metal oxide may be formed by thermally depositing a metal source, a metal oxide source, and an indium oxide source under an argon atmosphere. Further, a transmissive second electrode in which indium oxide is doped with a metal and a metal oxide may also be formed by thermally depositing a metal source and an indium source under an oxygen atmosphere. In this case, indium is oxidized to indium oxide and the indium oxide is deposited. Here, a portion of the metal is oxidized to metal oxide, and the metal oxide is deposited. Another portion of the metal is not oxidized, and the metal is deposited in a metal state. Furthermore, a transmissive second electrode in which indium oxide is doped with a metal and a metal oxide may also be formed by thermally depositing a metal source and an indium oxide source under an oxygen atmosphere. Here, a portion of the metal is oxidized to metal oxide, and the metal oxide is deposited. Another portion of the metal is not oxidized, and the metal is deposited in a metal state. The deposition atmosphere employed is not limited to an oxygen atmosphere.

That is, a transmissive second electrode in which indium oxide is doped with a metal and a metal oxide may be formed by thermally depositing a metal source and an indium source under a mixed atmosphere of oxygen and argon, thermally depositing a metal source and an indium oxide source under a mixed atmosphere of oxygen and argon, or thermally depositing a metal source, a metal oxide source, and an indium oxide source under a mixed atmosphere of oxygen and argon.

Since the second electrode 33 disposed on the pixel define layer 36 is transparent, external light incident on the second electrode 33 that is transmitted through the second electrode 33 and then reaches the pixel define layer 36 having a light-absorbing (or black) color. The light which has reached the pixel define layer 36 is absorbed by the pixel define layer 36, thus preventing (or reducing) the reflection of external light, thereby resulting in improved contrast.

The organic light-emitting layer 32 interposed between the first electrode 31 and the second electrode 33 emits light by electrical driving of the first electrode 31 and the second electrode 33. The organic light-emitting layer 32 may be formed of a low molecular weight organic material or a polymer organic material. When the organic light-emitting layer 32 is formed of a low molecular weight organic material, a hole transport layer, a hole injection layer, etc. are stacked on a surface of the organic light-emitting layer 32 facing the first electrode 31, and an electron transport layer, an electron injection layer, etc. are stacked on the other surface of the organic light-emitting layer 32 facing the second electrode 33. In addition, when needed, various other layers may be stacked. An available low molecular weight organic material may be copper phthalocyanine (CuPc), N,N'-di(naphthalene-1-yl)-N,N'-diphenyl-benzidine (NPB), tris-8-hydroxyquinoline aluminum (Alq3), or the like.

When the organic light-emitting layer 32 is formed of a polymer organic material, only a hole transport layer (HTL) may be disposed on a surface of the organic light-emitting layer 32 facing the first electrode 31. Here, the hole transport layer may be formed on the first electrode 31 by inkjet printing or spin coating utilizing poly-(2,4)-ethylene-dihydroxy thiophene (PEDOT), polyaniline (PANI) or the like. The organic light-emitting layer 32 may be made of PPV, soluble PPV's, cyano-PPV, polyfluorene, or the like, and may be color-patterned utilizing a method, such as inkjet printing, spin coating, and/or laser-assisted thermal transfer.

A sealing member 50 for sealing the organic light-emitting device 30 is disposed on the organic light-emitting device 30. The sealing member 50 serves to protect the organic light-emitting device 30 from external moisture or oxygen. In a top-emission type organic light-emitting display apparatus as illustrated in FIG. 1, the sealing member 50 is formed of a transparent material. For this, the sealing member 50 may be a glass substrate, a plastic substrate, or a multi-layered structure including an organic material and an inorganic material.

The organic light-emitting display apparatus according to the current embodiment of the present invention includes the pixel define layer 36 having a light-absorbing (or black color), thus reducing the reflection of external light. Moreover, the second electrode 33 disposed on the pixel define layer 36 is transmissive, and thus, does not adversely affect the reduction of reflection of external light by the pixel define layer 36.

Figure 2:
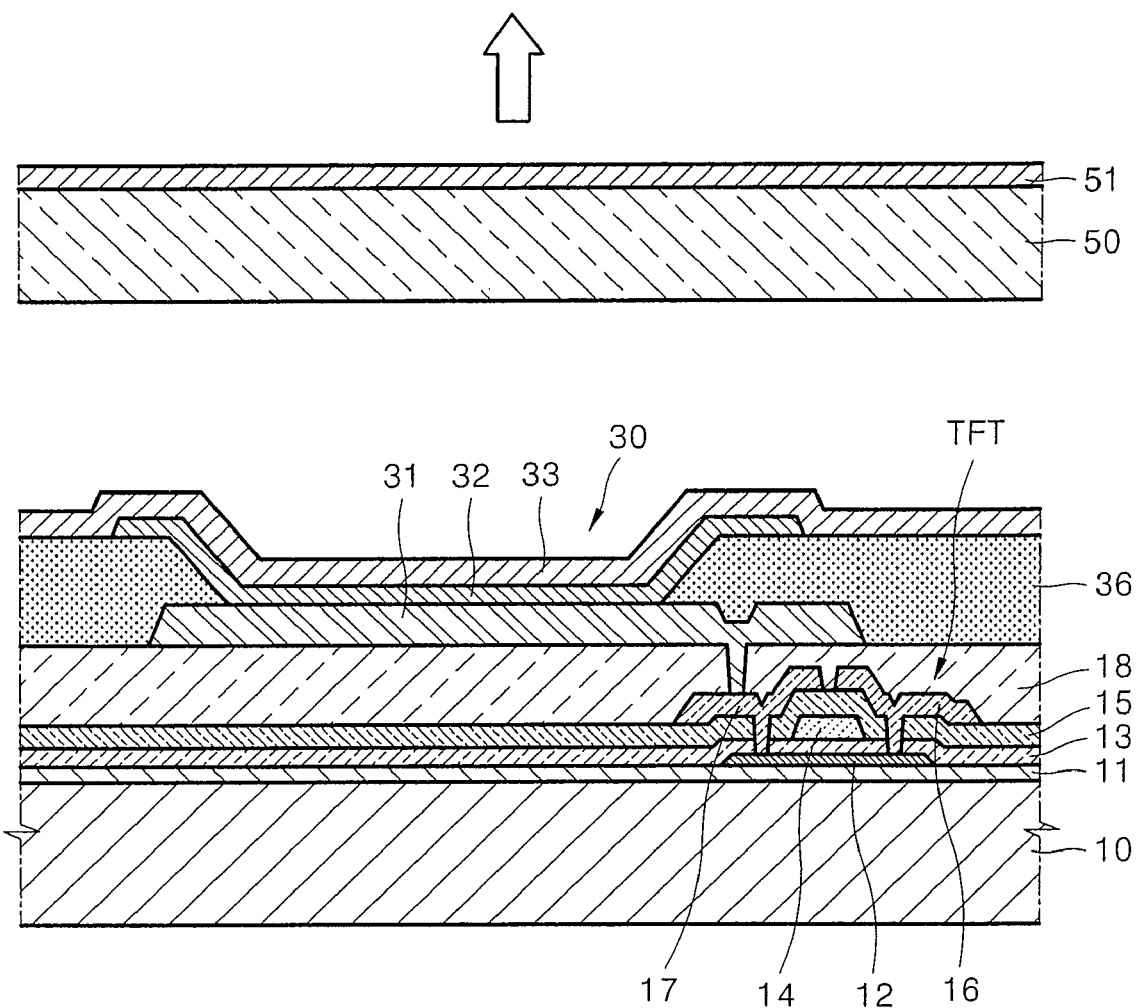
FIG. 2 is a schematic sectional view illustrating an organic light-emitting display apparatus according to another embodiment of the present invention.

FIG. 2 is a schematic sectional view illustrating an organic light-emitting display apparatus according to another embodiment of the present invention. Hereinafter, differences from the previous embodiment will be described. The same reference numerals refer to the same (or substantially the same) elements.

Referring to FIG. 2, an organic light-emitting display apparatus includes a substrate 10, an organic light-emitting device 30, a pixel define layer 36, a sealing member 50, and an antireflective layer 51. The antireflective layer 51 is disposed at an upper part of a surface of the sealing member 50 facing away from the organic light-emitting device. The antireflective layer 51 may include at least one material selected from $SiO_2$, $MgF$, $Al_2O_3$ $TiO_2$, $ZrO_2$, $ZnS$, ITO, $CeF_3$, $Ta_2O_5$, and/or $Nb_2O_5$. The antireflective layer 51 prevents (or reduces) the reflection of external light by a method such as scattering the external light. Furthermore, when a hard coating material is added to the antireflective layer 51, damage (e.g., scratches formed by external forces) to the organic light-emitting display apparatus can be prevented.

The antireflective layer 51 can prevent (or reduce) the reflection of external light that may occur on the sealing member 50, thereby significantly improving contrast.

As described above, an organic light-emitting display apparatus according to the present invention prevents (or reduces) the reflection of incident external light, thereby improving contrast.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof. For example, in the second embodiment, the first discharge electrode can be manufactured in a form of an electrode sheet having a straight electrode line. Further, the size of a through hole, and a shape and a size of a code portion may be changed.

What is claimed is:

1. An organic light-emitting display apparatus comprising:
   a substrate;
   an organic light-emitting device on the substrate, the organic light-emitting device comprising a first electrode, a second electrode, and an organic light-emitting layer between the first electrode and the second electrode; and
   a pixel define layer on the first electrode, the pixel define layer comprising an opening through which the first electrode is exposed and having a black color,
   wherein the first electrode is an anode and the second electrode is a cathode,
   wherein the first electrode is electrically coupled to a transistor by a contact hole,
   wherein the pixel define layer substantially covers the contact hole and the transistor,
   wherein the organic light-emitting layer and the second electrode are sequentially disposed on a portion of the first electrode exposed through the opening, and
   wherein the second electrode comprises indium oxide doped with a metal or metal oxide.

2. The organic light-emitting display apparatus of claim 1, wherein the pixel define layer comprises a mixture of an insulating material and a black pigment.

3. The organic light-emitting display apparatus of claim 2, wherein the insulating material comprises a material selected from the group consisting of polyimide, acryl, acrylate, silica, and combinations thereof.

4. The organic light-emitting display apparatus of claim 2, wherein the black pigment is carbon black or titanium black.

5. The organic light-emitting display apparatus of claim 1, wherein an absolute work function value of the metal or the metal oxide is smaller than that of the indium oxide.

6. The organic light-emitting display apparatus of claim 1, wherein the metal comprises a material selected from the group consisting of ytterbium (Yb), calcium (Ca), magnesium (Mg), samarium (Sm), cesium (Cs), barium (Ba), strontium (Sr), yttrium (Y), lanthanum (La), and combinations thereof.

7. The organic light-emitting display apparatus of claim 1, wherein the metal oxide comprises a material selected from the group consisting of strontium oxide, calcium oxide, cesium oxide, barium oxide, yttrium oxide, lanthanum oxide, and combinations thereof.

8. The organic light-emitting display apparatus of claim 1, further comprising a sealing member and an antireflective layer on an surface of the sealing member facing away from the organic light-emitting device.

9. The organic light-emitting display apparatus of claim 8, wherein the antireflective layer comprises a material selected from the group consisting of SiO2, MgF, Al2O3 TiO2, ZrO2, ZnS, ITO, CeF3, Ta2O5, Nb2O5, and combinations thereof.

10. The organic light-emitting display apparatus of claim 1, wherein the second electrode is a transmissive electrode to allow external light incident onto the second electrode to directly reach the pixel define layer.

11. The organic light-emitting display apparatus of claim 1, wherein the opening through which the first electrode is exposed is defined by a plurality of sides of the pixel define layer, and the plurality of sides of the pixel define layer slope away from the opening.

12. The organic light-emitting display apparatus of claim 1, wherein the organic light-emitting layer is at least partially disposed on a portion of the pixel define layer.

13. An organic light-emitting display apparatus comprising:
a substrate;
an organic light-emitting device on the substrate, the organic light-emitting device comprising a first electrode, a second electrode, and an organic light-emitting layer between the first electrode and the second electrode; and
a pixel define layer on the first electrode, the pixel define layer comprising an opening through which the first electrode is exposed and comprising a mixture of an insulating material and a pigment for reducing reflection of external light,
wherein the first electrode is an anode and the second electrode is a cathode,
wherein the first electrode is electrically coupled to a transistor by a contact hole,
wherein the pixel define layer substantially covers the contact hole and the transistor,
wherein the organic light-emitting layer is on a portion of the first electrode exposed through the opening and between the second electrode and the first electrode, and
wherein the second electrode comprises indium oxide doped with a metal.

14. The organic light-emitting display apparatus of claim 13, wherein the pigment is carbon black.

15. The organic light-emitting display apparatus of claim 13, wherein the pigment is titanium black.

16. The organic light-emitting display apparatus of claim 13, wherein the insulating material comprises a material selected from the group consisting of polyimide, acryl, acrylate, silica, and combinations thereof.

17. The organic light-emitting display apparatus of claim 13, further comprising a sealing member and an antireflective layer on a surface of the sealing member facing away from the organic light-emitting device.

18. The organic light-emitting display apparatus of claim 13, wherein an absolute work function value of the metal is smaller than that of the indium oxide.

19. An organic light-emitting display apparatus comprising:
a substrate;
an organic light-emitting device on the substrate, the organic light-emitting device comprising a first electrode, a second electrode, and an organic light-emitting layer between the first electrode and the second electrode; and
a pixel define layer on the first electrode, the pixel define layer comprising an opening through which the first electrode is exposed and comprising a mixture of an insulating material and a pigment for reducing reflection of external light,
wherein the first electrode is an anode and the second electrode is a cathode,
wherein the first electrode is electrically coupled to a transistor by a contact hole,
wherein the pixel define layer substantially covers the contact hole and the transistor,
wherein the organic light-emitting layer is on a portion of the first electrode exposed through the opening and between the second electrode and the first electrode, and
wherein the second electrode comprises indium oxide doped with a metal oxide.

20. The organic light-emitting display apparatus of claim 19, wherein the metal oxide comprises a material selected from the group consisting of strontium oxide, calcium oxide, cesium oxide, barium oxide, yttrium oxide, lanthanum oxide, and combinations thereof.

21. The organic light-emitting display apparatus of claim 19, wherein an absolute work function value of the metal oxide is smaller than that of the indium oxide.

* * * * *

UNITED STATES PATENT AND TRADEMARK OFFICE
CERTIFICATE OF CORRECTION

| | | |
|---|---|---|
| PATENT NO. | : 8,110,981 B2 | Page 1 of 1 |
| APPLICATION NO. | : 12/038725 | |
| DATED | : February 7, 2012 | |
| INVENTOR(S) | : Won-Yong Kim et al. | |

It is certified that error appears in the above-identified patent and that said Letters Patent is hereby corrected as shown below:

In the Claims

Column 9, Claim 8, line 14        Delete "an"
                                  Insert -- a --

Signed and Sealed this
Third Day of June, 2014

Michelle K. Lee
*Deputy Director of the United States Patent and Trademark Office*